US006549097B2

(12) United States Patent
Guillon et al.

(10) Patent No.: US 6,549,097 B2

(45) Date of Patent: Apr. 15, 2003

(54) ELECTRICAL RESONATOR WITH A RIBBON LOOP AND VARIABLE CAPACITORS FORMED AT THE PARALLEL ENDS

(75) Inventors: Bertand Guillon, Limoges (FR); Pierre Blondy, Limoges (FR)

(73) Assignee: Memscap (FR)

(*) Notice: Subject to any disclaimer, the term of this patent is extended or adjusted under 35 U.S.C. 154(b) by 0 days.

(21) Appl. No.: 09/975,352

(22) Filed: Oct. 11, 2001

(65) Prior Publication Data

US 2002/0047758 A1 Apr. 25, 2002

(30) Foreign Application Priority Data

Oct. 24, 2000 (FR) ........................................... 00 13619

(51) Int. Cl.[7] ............................ H03H 7/01; H03H 7/09

(52) U.S. Cl. ....................... 333/174; 333/175; 333/177; 333/185

(58) Field of Search ................................ 333/174–177, 333/184, 185

(56) References Cited

U.S. PATENT DOCUMENTS 5,959,515 A * 9/1999 Cornett et al. .......... 333/185 X
6,127,908 A * 10/2000 Bozler et al. ........... 333/246 X
6,404,304 B1 * 6/2002 Kwon et al. ................ 333/202

FOREIGN PATENT DOCUMENTS

JP 5-110315 4/1993 ............. H01P/7/08
WO WO 00/55936 9/2000 ........... H01P/1/203

OTHER PUBLICATIONS

C.S. Aitchiso et al., "Lumped–Circuit Elements at Microwave Frequencies", IEEE Transactions on Microwave Theory and Techniques, vol. 19, No. 12, Dec. 1971, pp. 928–937, XP002168256, IEEE Inc. New York, US;.

Guru Subramanyam, et al., "A K–Band Frequency Agile Microstrip Bandpass Filter Using a Thin–Film HTS/Ferroelectric/Dielectric Multilayer Configuration", IEEE Transactions on Microwave Theory and Techniques, vol. 48, No. 4, Apr. 2000.

Jia–Sheng Hong, et al., "On the Performance of HTS Microstrip Quasi–Elliptic Function Filters for Mobile Communications Application", IEEE Transactions on Microwave Theory and Techniques, vol. 48, No. 7, Jul. 2000.

Jia–Sheng Hong et al., "A High–Temperature Superconducting Duplexer for Cellular Base–Station Applications", IEEE Transactions on Microwave Theory and Techniques, vol. 48, No. 8, Aug. 2000.

* cited by examiner

*Primary Examiner*—Justin P. Bettendorf

(74) *Attorney, Agent, or Firm*—Wall Marjama & Bilinski LLP

(57) ABSTRACT

An elementary electrical resonator which includes a ribbon conductor forming a flat loop with at least one turn, the conductor having ends which form two parallel segments. The resonator further includes a conducting bridge which forms an arch straddling the two parallel segments of the ribbon conductor wherein opposing surfaces of the arch and the parallel segments form a capacitor. A part of the bridge is capable of being displaced with respect to the parallel segments under the action of a control signal so as to cause the capacitance of the capacitor and therefore the tuning frequency of the resonator to vary.

11 Claims, 6 Drawing Sheets

ELECTRICAL RESONATOR WITH A RIBBON LOOP AND VARIABLE CAPACITORS FORMED AT THE PARALLEL ENDS

FIELD OF THE INVENTION

The invention relates to the field of microelectronics, and more specifically to the sector for fabricating micro components, especially those intended to be used in radio or microwave applications. More specifically, it relates to electrical resonators that can be incorporated in analogue filters, and which enable the various parameters of such filters to be adjusted.

BACKGROUND OF THE INVENTION

As is known, electronic circuits used for radio-frequency or microwave applications, in particular such as mobile telephony, comprise filters including oscillating circuits or resonators. Such resonators generally consist of a combination of an inductor and a capacitor.

Under certain conditions, it is necessary to be able to change the parameters of the filter, and in particular its tuning frequency or its bandwidth.

Thus, it has already been proposed to form resonators by combining a capacitor with an inductor, one or other of these components exhibiting parameters which can be changed. Thus, it has been proposed to produce resonators with materials whose properties vary on application of a static magnetic field, such as yttrium iron garnet, commonly called YIG. Such components exhibit the major drawback of a very large footprint.

It has also been proposed to produce components whose properties vary when they are subjected to an electric field, such as ferroelectric materials. In particular, such a component is described in document "IEEE transactions on microwave theory and techniques", volume 48, number 4, April 2000, pages 525 to 530. Such components have the drawback of requiring relatively high bias voltages, and of exhibiting significant losses.

It has also been proposed to produce variable capacitors based on semiconducting materials. The variation of the capacitance operates on the principle of transfer of charge in the semiconductors. The drawbacks of these devices are significant losses and poor resistance to strong electrical signals.

It has also been proposed to produce variable capacitors by using a bank of elementary capacitors which can be connected in parallel by virtue of switching diodes, making it possible to add the capacitances of each elementary capacitor. This ability has the drawback of providing only a discrete adjustment of the capacitance, and in addition requires relatively high bias voltages.

Generally, all the techniques described above make it possible to produce only components which have relatively mediocre properties in terms of power and of loss.

In documents "IEEE transactions on microwave theory and techniques", volume 48, number 7, July 2000, pages 1240 to 1246, and "IEEE transactions on microwave theory and techniques" volume 48, number 8, August 2000, pages 1336 to 1343, it has been proposed to produce special resonators using a ribbon conductor arranged in the form of a loop above an earth plane. Such a component, when fed with a radio or microwave signal, operates due to the propagation of this signal between the ribbon conductor and the underlying earth plane. The tuning frequency of such a resonator is therefore directly determined by the length of the ribbon conductor, and more specifically, corresponds to a signal, the half wavelength of which corresponds to the opened-out length of the ribbon.

It will be realized that this type of distributed resonator has many drawbacks. This is because its tuning frequency is directly determined by its geometry, which means that beyond certain frequencies of the order of one gigahertz, such a resonator has dimensions with are incompatible with the production of integrated circuits.

Moreover, from the point of view of its design, such a resonator requires the presence of an earth plane for the propagation of the signal, which therefore gives it a three-dimensional structure which involves some restrictions on the production process.

One problem which the invention proposes to solve is how to adjust the various parameters of the resonator, and in particular its tuning frequency or its bandwidth, and this, over a relatively wide range, while remaining compatible with the footprint constraints of components used in microelectronics.

Another problem which the invention proposes to solve is how to vary the parameters of analogue filters incorporating such resonators.

SUMMARY OF THE INVENTION

The invention therefore relates to an elementary electrical resonator. Such a resonator is characterized in that it comprises:

- a ribbon conductor forming a flat loop with at least one turn, the ends of which form two parallel segments;
- a conducting bridge forming an arch straddling the said segments of the ribbon conductor, the opposing surfaces of the arch and of the said segments forming a capacitor;
- and in which a part of the bridge is capable of being displaced with respect to the said segments of the loop under the action of the control signal so as to cause the capacitance of the said capacitor, and therefore the tuning frequency of the resonator, to vary.

In other words, the elementary resonator according to the invention comprises a ribbon forming the inductor, and a conducting bridge which straddles part of the inductor, so as to form a variable capacitor. The combination of this capacitor and of the inductor forms a resonator whose tuning frequency can be changed by varying the capacitance of this capacitor.

In the rest of the description, the ribbon conductor and the conducting bridge can be made from various materials, namely metals or alternatively semiconductors.

The flat loop and the conducting bridge do not require the presence of an earth plane for any signal propagation. In this way such components can be very easily produced, directly on layers of quartz or of silicon or of other types of substrate. These resonators can be integrated into microcomponents specific to filtering functions, or else alternatively they can be produced over an integrated circuit providing other functions.

In practice, the conducting bridge forming the variable capacitor can be deformed by the application of various forces used in the technologies commonly known by the abbreviation "MEMS" meaning "microelectromechanical systems". Thus the conducting bridge can be deformed under the action of an electrostatic force using a d.c. voltage applied between the arch and the ribbon conductor. The force which generates the deformation of the arch may also have its origin in a thermal or magnetic phenomenon.

Advantageously in practice, the conducting bridge may be combined with at least one further conducting bridge, arranged in parallel and actuated by a different control signal so as to cause the variable capacitance to vary over a wider range. This therefore amounts to dividing up the total surface forming the capacitor, and causing the elementary capacitor of each bridge to vary independently.

Advantageously in practice, the elementary electrical resonator may in addition comprise:

- an additional track, parallel to the segments forming the ends of the loop;
- an additional conducting bridge, also forming a variable capacitor, straddling the said additional track and one of the two segments forming the ends of the loop.

In other words, in this configuration, the resonator is combined with an additional capacitor forming a decoupling capacitor.

Thus, the resonator can be used as a filter, when it comprises two connection terminals, that is to say:

- a first terminal located on the additional track;
- a second terminal located on the segment which is not straddled by the additional conducting bridge.

This filter has an electrical behaviour corresponding to an equivalent circuit comprising, in series, a capacitor and a parallel LC dipole.

By adjusting the additional capacitor, the input impedance of the filter is adjusted, while adjustment of the first variable capacitor makes it possible to tune the resonant frequency of the filter.

The structure of the elementary resonator, (whether or not including the decoupling capacitor as described above) can be used to build filters with several poles, by coupling the various elementary resonators together. It is thus possible to form high-order filters or filters comprising transmission zeros.

In practice, elementary resonators can be coupled by a conducting bridge forming a variable capacitor, which straddles two segments forming the end of a loop of a resonator, these two segments belonging to two different resonators. In other words, two resonators, each including a loop and a conducting bridge, are coupled by one of the ends of their loop, using a bridge forming a variable capacitor. The combination of these two resonators is equivalent to the coupling of two elementary resonators described above by a shared coupling capacitor.

At the level of an equivalent circuit, such an assembly operates as two parallel LC dipoles between which a variable capacitor is connected. Depending on the capacitance of this capacitor which couples the two resonators, it is possible to vary the bandwidth of a filter which includes these two resonators.

The coupling between two elementary resonators may also take place via regions of each ribbon conductor located one facing the other. In other words, each loop has a portion of its length placed side by side with a portion of the other loop, such that the two resonators are coupled by magnetic coupling.

This coupling can be made variable since the regions facing one another can be straddled by an additional conducting bridge which forms a variable capacitor, and which therefore makes it possible to adjust the degree of coupling between the two elementary resonators.

A particular example of a resonator according to the invention may comprise two elementary resonators including a loop and a bridge forming a variable capacitor, and an additional conducting bridge forming an additional variable capacitor, which straddles one of the segments forming one end of the loop of each elementary resonator. In other words, it involves two resonators coupled at the ends of their loop by a shared decoupling capacitor.

In practice, such a resonator may be integrated into a filter which, in addition, comprises two additional tracks, each placed opposite a loop of each elementary resonator, each additional track thus being coupled to the region of the loop opposite, the ends of the two additional tracks forming connection terminals for the filter.

The coupling between the additional tracks and the loops of the elementary resonators can be achieved by two additional conducting bridges forming a variable capacitor, each one straddling an additional track and the region of the loop of the elementary resonator located opposite. Thus, by varying the coupling between the tracks forming the input and the output of the filter and the intermediate resonators, it is possible to vary certain characteristics of the filter such as the input and output impedances, the bandwidth and the central frequency.

Of course, the invention is not limited to filters including two resonators, but covers variants in which the number of resonators is chosen to suit the desired transfer function. It is thus possible to increase the number of resonators, it being thus possible for the total number to be greater than ten.

BRIEF DESCRIPTION OF THE DRAWINGS

The method of embodying the invention and the advantages which result therefore will emerge clearly from the following description of the embodiments with reference to the appended figures in which.

DETAILED DESCRIPTION OF THE INVENTION

As already stated, the invention relates to an electrical resonator which can be incorporated in a very wide range of analogue filters.

Figure 1:
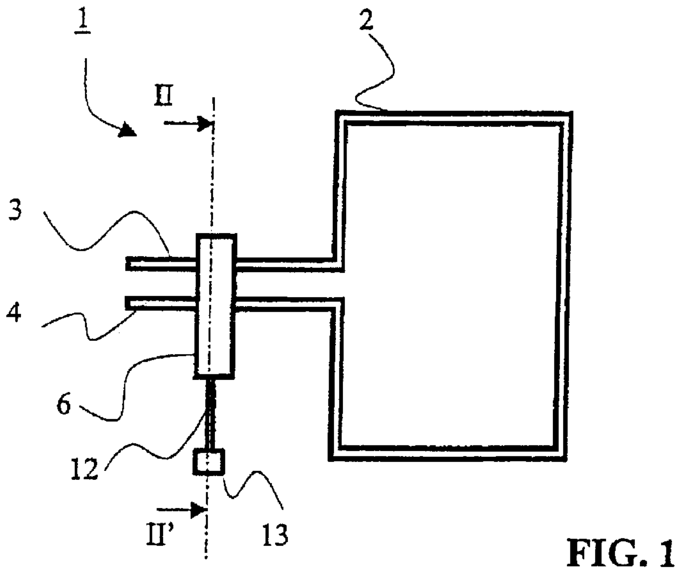
FIG. 1 is a diagram of the configuration of an elementary resonator.
Figure 2:
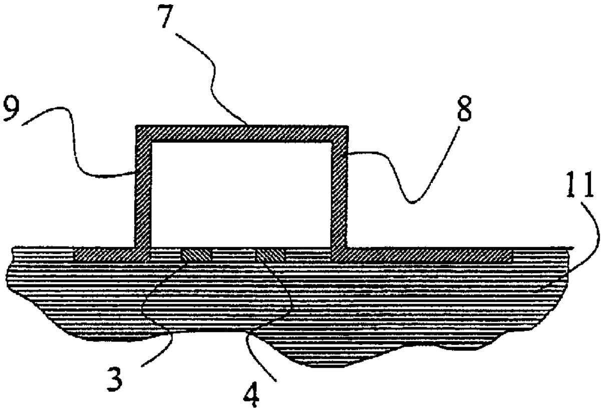
FIG. 2 is a sectional view taken on the plane II-II' of FIG. 1.

The elementary structure of such a resonator is illustrated in FIGS. 1 and 2. Such a resonator (1) essentially consists of a conducting loop (2) and of a conducting bridge (6). More specifically, the loop (2) is formed from a metal or semiconductor ribbon conductor, the geometry of which may adopt a square shape as illustrated in FIG. 1. Nevertheless, the invention is not limited to this single embodiment, but also covers loops of different geometry, rectangular, polygonal, circular or others. The loop (2) illustrated in FIG. 1 comprises two terminal segments (3, 4) which form the ends thereof. The two segments (3, 4) are arranged parallel to one another so that the loop can be closed. The area of the loop (2) substantially defines the value of the equivalent inductance of the resonator loop.

The ribbon forming the loop (2) can be obtained using various technologies, depending on the type of microcomponent which incorporates it. Thus, in a technology using an electrolytic production process, the ribbon may be metallic and obtained by electrolytic deposition of copper in grooves etched in an insulating substrate such as silica. Nevertheless, other technologies may also be used such as those using several levels of semiconductor material separated by sacrificial layers.

According to another characteristic of the invention, the resonator (1) comprises a bridge (6) made of a metal or semiconductor conducting material, which straddles the two segments (3, 4) which form the ends of the loop (2). This bridge (6) is illustrated in FIG. 2. It comprises a segment (7) parallel to the plane of the substrate and two pillars (8, 9) which connect the horizontal segment (7) to the substrate (11). The surface opposite the horizontal segment (7) and the segments (3, 4) of the loop (2), forms a capacitor. The capacitance of this capacitor is essentially adjusted by the distance separating the segment (7) from the bridge (6) and the segments (3, 4) of the loop.

According to the invention, the bridge (6) can be deformed under the action of an adjustable force, in such a way that the distance between the horizontal segment (7) and the segments (3, 4) of the loop can be adjusted.

In this way, the value of the capacitance existing between the horizontal segment (7) of the bridge (6) and the segments (3, 4) of the loop can be altered, and consequently the tuning frequency of the resonator.

In practice, the bridge (6) can be obtained by various technologies. In the electrolytic deposition technology, this arch (6) consists of a copper coating which can be made on top of a sacrificial layer placed over the substrate (11), then subsequently removed. Nevertheless, other technologies in which the arch is not made of copper but of another metal or even of a semiconductor, can be used.

The bridge (6) can be deformed on application of an electrostatic force, which results from the application of a d.c. voltage between the bridge (6) and the segments (3, 4) of the loop. To this end, the bridge (6) is extended via a track (12) up to a connection pad (13) to which the d.c. voltage is applied. As already said, the force causing the deformation of the bridge need not be electrostatic in origin and may, for example, result from an expansion phenomenon or from the application of a magnetic field.

Figure 3:
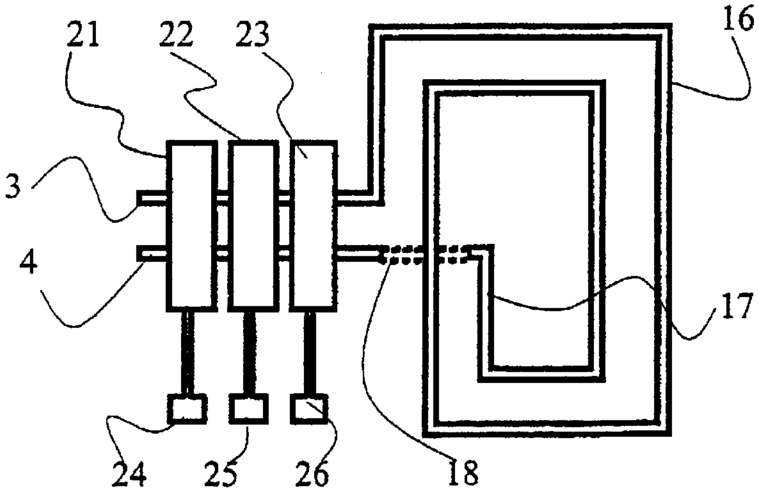
FIG. 3 is a diagram of an alternative embodiment of the resonator of FIG. 1.

As illustrated in FIG. 3, the loop (16) may have a number of turns greater than one, so as to increase the value of the inductance and therefore its quality coefficient. In this case, the section (18) of the loop connecting the winding centre (17) and the segment (3) forming the end of the loop, form a layer located above or below the rest of the winding (16).

As also illustrated in FIG. 3, the segments (3, 4) of the loop may be straddled by several bridges (21, 22, 23), arranged in parallel and each controlled by a separate signal at the three different connection pads (24, 25, 26).

Increasing the number of bridges straddling the segments (3, 4) makes it possible, on the one hand, to increase the surface area of the overall capacitor formed by the set of bridges (21, 22, 23) and the segments (3, 4), and, on the other hand, to allow the separate control of each of these bridges. In this way, it is easier to cover a wider range of capacitance values, and this with greater accuracy.

The elementary resonator illustrated in FIG. 1 can be incorporated into more complex filters, as illustrated in FIGS. 4, 6, 9 and 11.

EXAMPLE 1

Figure 4:
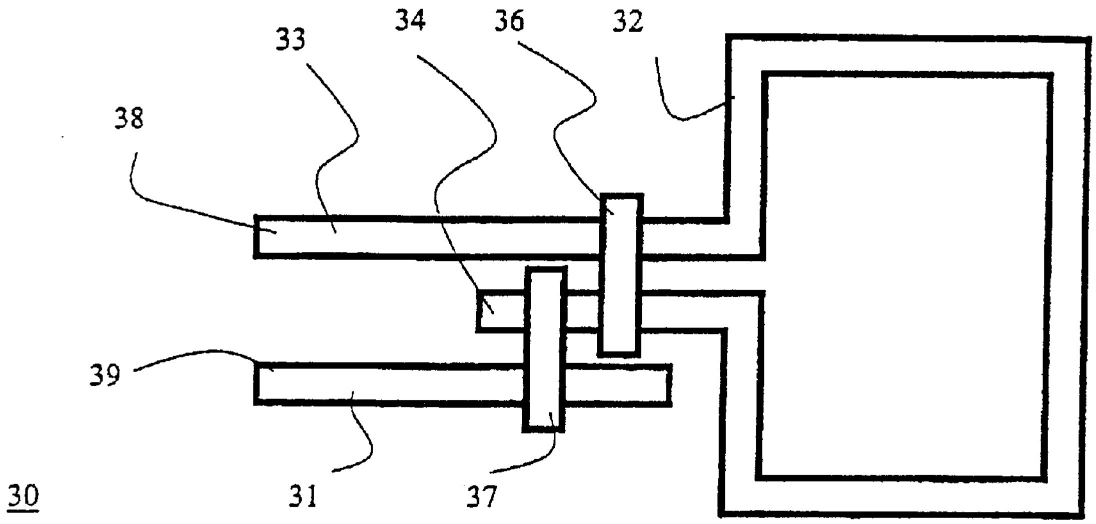
FIG. 4 is a diagram of the configuration of a filter including a resonator according to the invention.

Thus, the filter illustrated in FIG. 4 comprises an elementary resonator including a loop (32) and a bridge (36) straddling the segments (33, 34) of the loop (32). Of course, although this is not illustrated, the loop (32) may comprise many turns, and the bridge (36) can be broken down into a plurality of elementary bridges.

This filter (30) comprises an additional track (31), arranged in parallel to the segment (34). This track (31), which is made in the same way as the loop (32), is straddled by a bridge (37) which also straddles the segment (34) of the loop (32). This bridge (37) forms a variable capacitor with the segment (34) of the loop (32) and the track (31). This variable capacitor is controlled by the same method as the bridge (36). In particular, it may consist of a plurality of elementary bridges in parallel.

Figure 5:
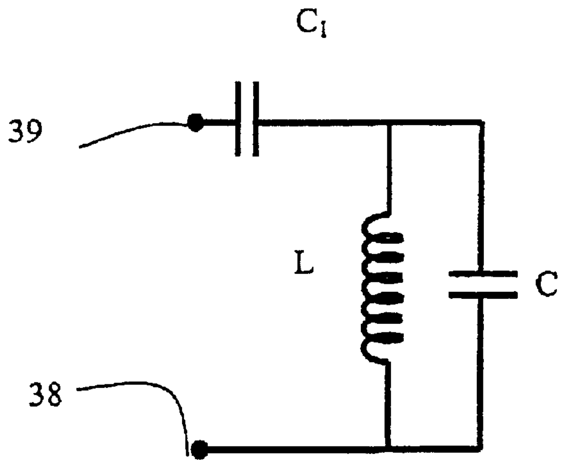
FIG. 5 is an equivalent circuit of the electrical operation of the filter of FIG. 4.

The equivalent circuit of the filter of FIG. 4 is illustrated in FIG. 5. Thus, the inductance of the loop (32) substantially corresponds to the inductance L of FIG. 5. The variable capacitor of the bridge (36) corresponds to the capacitor C of FIG. 5. The capacitor formed by the bridge (37) corresponds to the variable capacitor C1 of FIG. 5, so that between the terminals 38 and 39, the filter of FIG. 4 corresponds to a parallel LC circuit in series with the capacitor C1. The variation in the height of the bridge (36) makes it possible to vary the capacitor C, and therefore the tuning frequency of the resonator LC. The variation of the capacitor C1 makes it possible to match the impedance of the filter.

EXAMPLE 2

Figure 6:
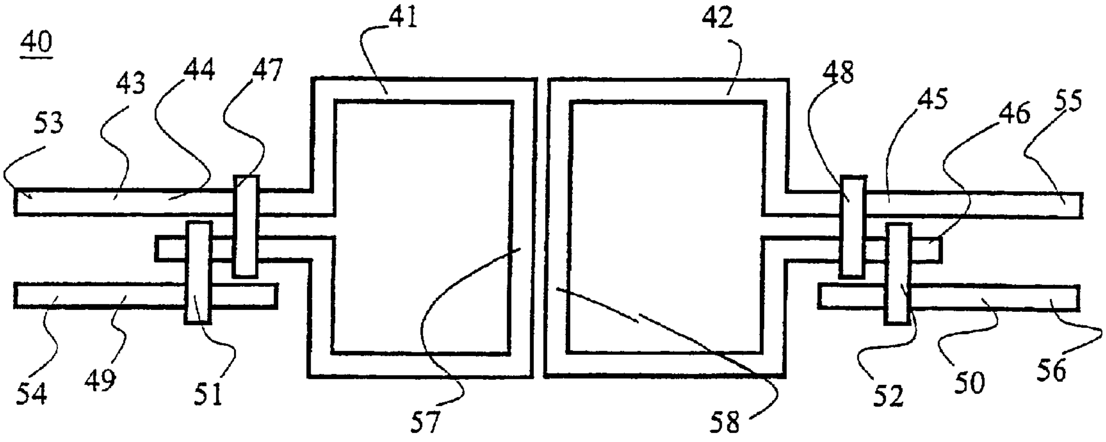
FIG. 6 is a configuration diagram of a filter with two poles.
Figure 7:
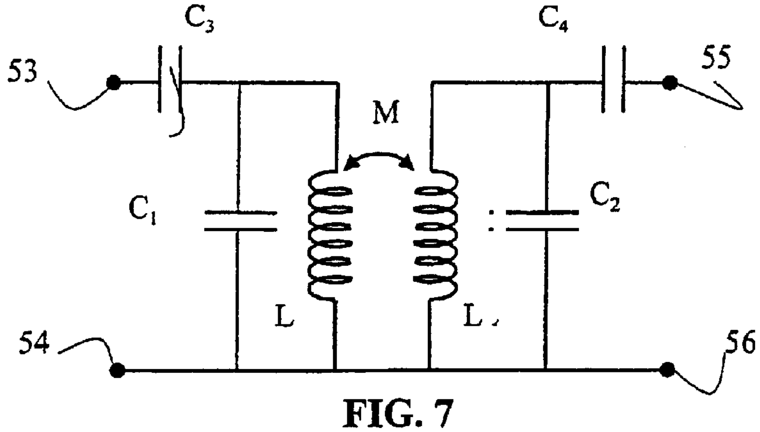
FIG. 7 is an equivalent circuit of the operation of the filter of FIG. 6.
Figure 8:
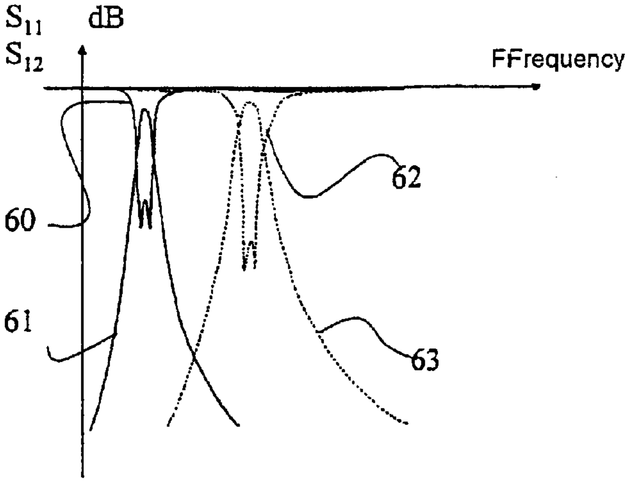
FIG. 8 is a graph illustrating the transfer function in reflection and in transmission of the filter of FIG. 6.

FIGS. 6, 7, 8 correspond to a second filter, the configuration of which is illustrated in FIG. 6. This filter uses two filters corresponding to FIG. 4, and in which the loops are coupled by opposite regions.

More specifically, this filter (40) comprises two elementary resonators, each one comprising a loop (41, 42), and each loop comprises two end segments (43, 44, 45, 46). These end segments (43, 44; 45, 46) are straddled in pairs by variable capacitors (47, 48). Each of these resonators also comprises an additional track (49, 50) which is straddled, with one of the segments (44, 46), by an additional bridge (51, 52).

The regions (57, 58) of loops (41, 42) are arranged in parallel, one opposite the other. These two regions (57, 58) are close enough for the magnetic field generated by the current passing through the region (57) to induce a current in the region (58) of the other loop, and vice versa. In this way, the inductors formed by the loops (41, 42) are magnetically coupled.

In an embodiment not illustrated, the regions (57, 58) may be straddled by an additional conducting bridge providing a capacitative coupling between the loops (41, 42).

The equivalent circuit of this filter, between the input (53, 54) and output (55, 56) terminals is illustrated in FIG. 7, in which the capacitors C1 and C2 corresponding to the main bridges (47, 48) and determining the tuning frequency of each of the elementary resonators, are observed. The capacitors C3 and C4 correspond to the decoupling capacitors formed by the bridges (51, 52). The mutual inductance M corresponds to the coupling present between the regions (57, 58) of the loops (41, 42). FIG. 8 shows four curves illustrating the transfer functions of the filter of FIG. 6, for different values of the different capacitors.

Thus, the curves (60, 61) in solid line correspond respectively to the reflection ($S_{11}$) and transmission ($S_{12}$) parameters of the filter. The curves (62, 63) in broken line corresponding respectively to the same parameters, with a reduction in the capacitances so as to increase the resonant frequency while maintaining the filter matching.

This type of filter can especially be used as a front-end band pass filter for mobile telephony, on being adapted to several standards and more generally to multiband, multistandard radio-frequency receivers.

EXAMPLE 3

Figure 9:
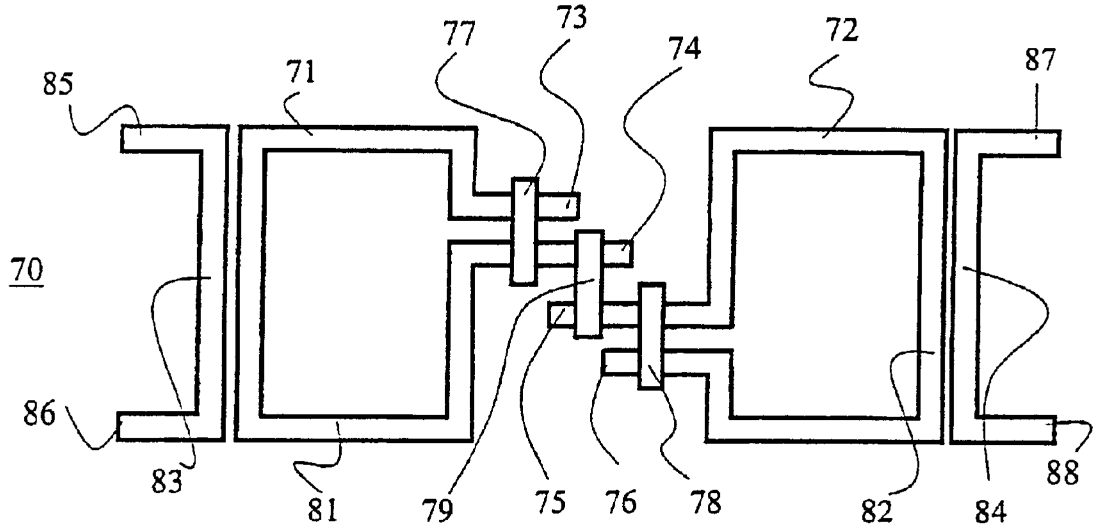
FIG. 9 is a configuration diagram of another filter with two poles.
Figure 10:
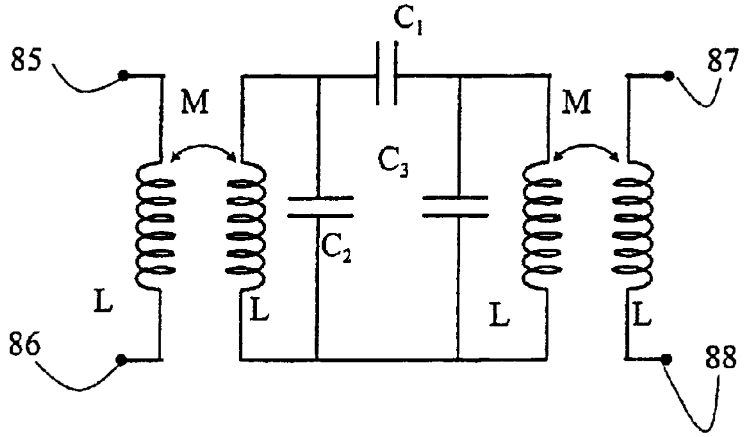
FIG. 10 is an equivalent circuit of the operation of the filter of FIG. 9.
Figure 11:
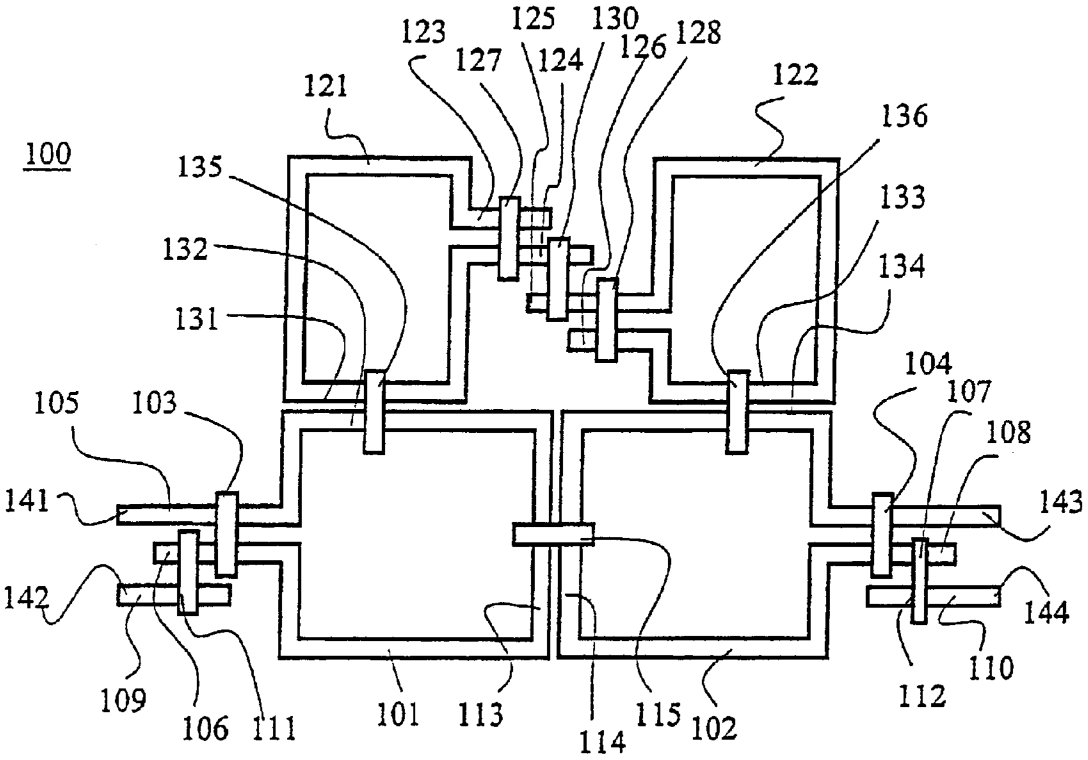
FIG. 11 is a configuration diagram of another filter with four poles.

FIGS. 9, 10 and 11 relate to another filter made from elementary resonators.

Thus, such a filter (70) comprises two loops (71, 72), each possessing end segments (73, 74, 75, 76), the segments (73, 74) of the loop (71) being straddled by a bridge (77). The segments (75, 76) of the loop (72) are straddled by a bridge forming a variable capacitor (78).

In addition, the segment (74) of the loop (71) and the segment (75) of the loop (72) are straddled by an additional conducting bridge (79). This additional bridge (79) therefore provides capacitative coupling between the resonators formed from loops (71, 72).

Moreover, the loops (71, 72) each have a region (81, 82), each of which is opposite an additional track (83, 84). The tracks (83, 81) and (82, 84) are close enough to be magnetically coupled. The filter (70) comprises input terminals (85, 86, 87, 88) located at the respective ends of the tracks (83, 84).

FIG. 10 illustrates the equivalent circuit of the filter of FIG. 9, in which can be seen, starting from the left:

- the mutual inductance M between the track (81, 83),
- the inductance L of the loop (71),
- the capacitor C2 of the bridge formed by the bridge (77),
- the coupling capacitor C1 between the loops (71, 72) generated by the bridge (79),
- the capacitor C3 formed by the bridge (78),
- the inductor L formed by the loop (72), and
- the mutual inductance between the region (82) of the loop (72) and the region (84) located between the output terminals (87, 88).

Thus, by varying the values of the various capacitors C1, C2, C3, it is possible to vary the relative positions of the various poles of the filter, or its central frequency. The magnetic coupling between the regions (83, 81) and (82, 84) could also be supplemented by a capacitative coupling via deformable bridges (not shown).

The various transmission and reflection parameters of the filter of FIG. 9 are similar to those of the filter of Example 2, however, with the possibility of adjusting the bandwidth of the filter, the input coupling being fixed.

EXAMPLE 4

FIG. 11 illustrates another filter made according to the invention which incorporates four elementary resonators.

More specifically, this filter (100) is derived from the combination of the filters illustrated in FIGS. 6 and 9. Thus, the loops (101, 102) are in a configuration similar to that of FIG. 6, and each one comprises a bridge (103, 104) which straddles their end segments (105, 106, 107, 108). These loops (101, 102) also comprise an additional track (109, 110). These tracks (109, 110) are straddled by bridges (111, 112) which also straddle the segments (106, 108) of loops (101, 102).

The loops (101, 102) possess parallel regions (113, 114) which are therefore magnetically coupled, this magnetic coupling is reinforced by capacitative coupling via the bridge (115) which straddles the two regions (113, 114).

The filter (100) also comprises two loops (121, 122), the end segments (123, 124, 125, 126) of which are respectively straddled in pairs by bridges (127, 128).

These loops (121, 122) use the central structure of the filter of FIG. 9.

In addition, these two loops (121, 122) are coupled by a bridge (130) which straddles the segment (124) of the loop (121) and the segment (125) of the loop (122).

The loops (121, 122) are coupled to the loops (101, 102) respectively. This coupling is achieved by the proximity of the regions (131, 132) with regard to loops (101, 121) and by regions (133, 134) for the loops (122, 102). This coupling can be reinforced by bridges (135, 136) forming a variable capacitor.

Figure 12:
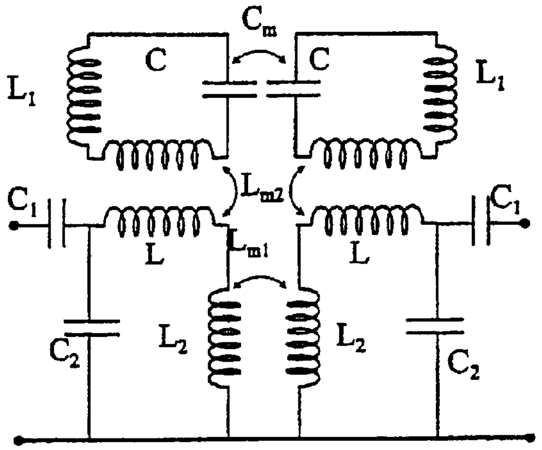
FIG. 12 is an equivalent circuit of the operation of the filter of FIG. 11.

FIG. 12 shows an equivalent circuit in which two capacitors C1 and C2, which serve to adjust the input coupling of the filter, are seen. Four inductors $L_1$, $L_2$, which correspond to the loops (101, 121, 133, 102) of FIG. 11, are also seen. By proximity, these four inductors are coupled, which is shown on the diagram by mutual inductances ($Lm_1$ and $Lm_2$). Two loops, at the top of FIG. 12, are coupled by a mutual capacitance (Cm). Arranged in this way, all the resonators and coupling structures make it possible to produce a filtering function comprising transmission zeros or an equalisation of the group time. All the filter parameters, namely bandwidth, central frequency, position of transmission zeros, input impedance, can be adjusted by altering the capacitances.

Figure 13:
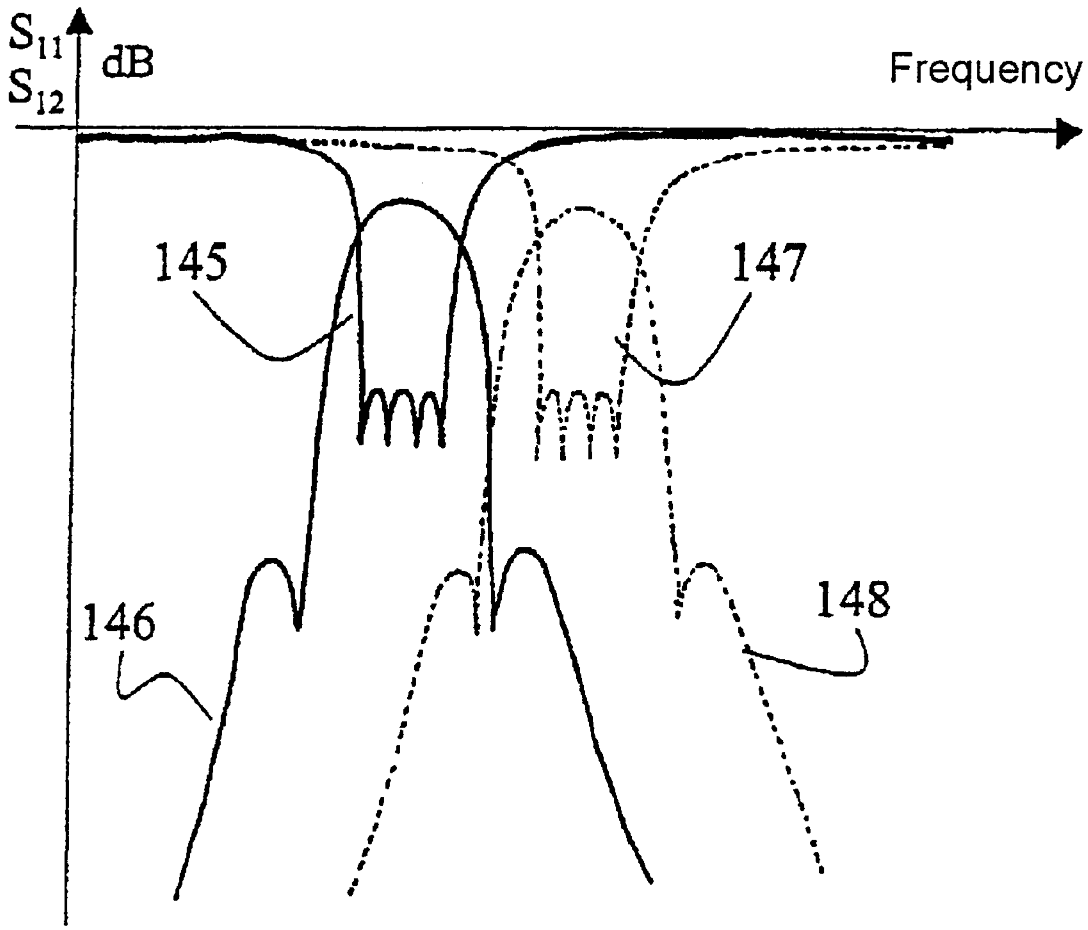
FIG. 13 is a graph of the transfer functions in reflection and in transmission of the filter of FIG. 11.

FIG. 13 shows the reflection and transmission parameters of the filter of FIG. 11 measured between the terminals (141, 142, 143, 144) for two sets of capacitance values. More specifically, the curves in solid line (145) and (146) show the parameters $S_{11}$ and $S_{12}$ of this filter. The curves in broken line (147) and (148) show the same parameters after alteration of the adjustable capacitance values.

It emerges from the above that the resonator is according to the invention, and the various filters in which it can be incorporated have many advantages, and in particular:

- no earth plane, hence a planar geometry which makes it very easy to integrate either into a specific microcomponent, or into a microcomponent that includes other functionalities, or directly on top of a pre-existing integrated circuit;
- the possibility of including it in multiple filters, comprising a particularly high number of poles;
- the possibility of varying all the characteristic parameters inside such filters, that is to say especially the tuning frequencies, the position of the transmission zeros and the bandwidth.

The various advantages make it possible to produce multiple analogue filters used in very broad frequency ranges from one gigahertz to several tens of gigahertz.

This resonator can therefore be easily integrated into microcomponents used in radio or microwave applications, and especially in the field of mobile telephony, or more generally in all analogue and digital radio devices able to receive several standards.

What is claimed is:

1. An elementary electrical resonator comprising:

a ribbon conductor forming a flat loop with at least one turn, in which the ends of said ribbon conductor form two parallel segments;

a first conducting bridge forming an arch straddling said parallel segments of said ribbon conductor in which opposing surfaces of the arch and of said parallel segments forms a capacitor, and in which a part of the first conducting bridge is capable of being displaced with respect to said parallel segments under the action of a control signal so as to cause the capacitance of said capacitor, and therefore the tuning frequency of said resonator to vary;

a track parallel to the two parallel segments forming the ends of the flat loop; and a second conducting bridge also forming a variable capacitor, said second bridge straddling said track and one of said two parallel segments forming the ends of the flat loop.

2. An elementary electrical resonator according to claim 1, including two connection terminals including a first terminal located on the track, and a second terminal located on the parallel segment of said ribbon conductor which is not straddled by the second conducting bridge.

3. An elementary electrical resonator according to claim 1, wherein at least one conducting bridge is combined with at least one additional conducting bridge arranged in parallel therewith and actuated by a different control signal so as to cause the variable capacitor to vary over a wider range.

4. An electrical resonator, including a plurality of elementary resonators according to claim 1 which are coupled.

5. An electrical resonator according to claim 4, wherein at least two coupled elementary resonators are coupled by a conducting bridge forming a variable capacitor, said conducting bridge straddling two segments forming the end of a loop of said resonator, said two segments each belonging to two different coupled resonators.

6. An electrical resonator according to claim 4, wherein at least two of the elementary resonators are coupled by regions of each ribbon conductor located one opposite the other.

7. An electrical resonator according to claim 6, wherein said regions of each ribbon conductor are straddled by a conducting bridge forming a variable capacitor, so as to adjust the degree of coupling between the two elementary resonators.

8. An electrical resonator according to claim 4, further including a metal conducting bridge forming a variable capacitor, straddling one of the segments forming the end of the loop of each elementary resonator.

9. An electrical resonator according to claim 8, including two additional tracks each arranged opposite a region of a loop of each coupled elementary resonator, each additional track thus being coupled to the region of the opposite loop, and in which the ends of the two additional tracks form connection terminals.

10. An electrical resonator according to claim 9, including two additional conducting bridges forming a variable capacitor, each said bridge straddling an additional track and the region of the loop of the elementary resonator located opposite therefrom.

11. A multiple resonator including a plurality of resonators according to claim 4, wherein said coupled resonators include coupled loops.

* * * * *